United States Patent
Liebmann et al.

(10) Patent No.: US 12,040,271 B2
(45) Date of Patent: Jul. 16, 2024

(54) POWER DELIVERY NETWORK FOR CFET WITH BURIED POWER RAILS

(71) Applicant: Tokyo Electron Limited, Tokyo (JP)

(72) Inventors: Lars Liebmann, Halfmoon, NY (US); Jeffrey Smith, Clifton Park, NY (US); Daniel Chanemougame, Niskayuna, NY (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/331,651

(22) Filed: Jun. 8, 2023

(65) Prior Publication Data

US 2023/0326855 A1  Oct. 12, 2023

Related U.S. Application Data

(62) Division of application No. 16/659,251, filed on Oct. 21, 2019, now Pat. No. 11,735,525.

(51) Int. Cl.
*H01L 23/528*   (2006.01)
*H01L 21/768*   (2006.01)
*H01L 23/522*   (2006.01)

(52) U.S. Cl.
CPC .... *H01L 23/5286* (2013.01); *H01L 21/76877* (2013.01); *H01L 21/76895* (2013.01); *H01L 23/5226* (2013.01); *H01L 23/5283* (2013.01)

(58) Field of Classification Search
None
See application file for complete search history.

(56) References Cited

U.S. PATENT DOCUMENTS 7,923,755 B2 *  4/2011  Mizushino ........ H01L 27/11807
                                                    326/47
9,947,664 B1 *  4/2018  Anderson ............. H01L 25/071
(Continued)

FOREIGN PATENT DOCUMENTS

TW         201803084 A      1/2018

OTHER PUBLICATIONS

International Preliminary Report on Patentability and Written Opinion of the International Searching Authority dated Nov. 30, 2020, in PCT/US2020/047135, filed Aug. 20, 2020, 9 pages.
(Continued)

*Primary Examiner* — Nishath Yasmeen
(74) *Attorney, Agent, or Firm* — Oblon, McClelland, Maier & Neustadt, L.L.P.

(57) ABSTRACT

Aspects of the present disclosure provide a method for fabricating a semiconductor device. For example, the method can include forming a first power rail, forming a first power input structure for coupling with a first terminal of a power source that is external of the semiconductor device to receive electrical power from the power source, forming an active device between the first power rail and the first power input structure, and forming a first middle-of-line rail with a plurality of layers. The first middle-of-line rail can be configured to deliver the electrical power from the first power input structure to the first power rail. The first power rail can provide the electrical power to the active device for operation. Topmost and bottommost ones of the layers of the first middle-of-line rail can be as high as and leveled with top and bottom surfaces of the active device, respectively.

13 Claims, 6 Drawing Sheets

(56) References Cited

U.S. PATENT DOCUMENTS

| | | | |
|---|---|---|---|
| 9,997,598 B2 | 6/2018 | Smith et al. | |
| 10,453,850 B2 | 10/2019 | Smith et al. | |
| 10,529,830 B2 | 1/2020 | Tapily et al. | |
| 10,573,655 B2 | 2/2020 | Smith et al. | |
| 10,607,938 B1* | 3/2020 | Rubin | H01L 21/823475 |
| 10,636,739 B2 | 4/2020 | Beyne et al. | |
| 10,700,207 B2 | 6/2020 | Chen et al. | |
| 10,763,365 B2 | 9/2020 | Chen et al. | |
| 10,770,479 B2 | 9/2020 | Smith et al. | |
| 2004/0262635 A1 | 12/2004 | Lee | |
| 2008/0169487 A1* | 7/2008 | Shimbo | H01L 27/0207 |
| | | | 257/E27.07 |
| 2012/0292777 A1* | 11/2012 | Lotz | H01L 23/5286 |
| | | | 438/459 |
| 2018/0026042 A1 | 1/2018 | Smith et al. | |
| 2018/0040695 A1 | 2/2018 | Smith et al. | |
| 2018/0047832 A1 | 2/2018 | Tapily et al. | |
| 2018/0145030 A1 | 5/2018 | Beyne et al. | |
| 2018/0218106 A1* | 8/2018 | Delk | G06F 30/394 |
| 2018/0240802 A1 | 8/2018 | Smith et al. | |
| 2018/0374791 A1 | 12/2018 | Smith et al. | |
| 2019/0164882 A1 | 5/2019 | Chen et al. | |
| 2019/0165177 A1 | 5/2019 | Chen et al. | |
| 2019/0165178 A1 | 5/2019 | Chen et al. | |
| 2019/0172828 A1* | 6/2019 | Smith | H01L 21/28088 |
| 2019/0244900 A1* | 8/2019 | Frederick, Jr. | H01L 23/5386 |
| 2019/0259702 A1* | 8/2019 | Jain | C12Q 1/6886 |
| 2019/0288004 A1 | 9/2019 | Smith et al. | |
| 2019/0326301 A1 | 10/2019 | Smith et al. | |
| 2020/0098897 A1 | 3/2020 | Tapily et al. | |

OTHER PUBLICATIONS

Taiwan Office Action/Notification of Examination Opinions issued Mar. 7, 2024 in Taiwanese Patent Application No. 109136089, filed Oct. 19, 2020, along with the English translation of the same, Letter and comments, 17 pages.

* cited by examiner

POWER DELIVERY NETWORK FOR CFET WITH BURIED POWER RAILS

TECHNICAL FIELD

The present disclosure describes embodiments generally related to semiconductor devices and manufacturing process.

BACKGROUND

Historically, in semiconductor industry, transistors have been created in one plane, with wiring/metallization formed above, and have thus been characterized as two-dimensional (2D) circuits or 2D fabrication. Scaling efforts have greatly increased the number of transistors per unit area in 2D circuits. As traditional 2D scaling is showing rapidly reduced return on investment, the semiconductor industry is looking to the $3^{rd}$ dimension to maintain node-to-node improvement in power-performance-area-cost (PPAC). A very promising approach to utilizing the vertical axis in improving transistor density is a new device architecture known as complementary FET (CFET). In the CFET approach, a logic cell having N-type device and P-type device is essentially folded, such that one of the two devices, such as P-type device, is disposed on-top of the other device of the two devices, such as the N-type device while sharing a common gate.

SUMMARY

Folding the two complementary devices on top of each other and eliminating the substantial lateral space needed between the N-type and P-type devices, puts the standard cell logic design in a domain where cell height is limited by the cumulative width of required wiring tracks rather than device width. At the scaling limit, the cell height has to accommodate 4 wiring tracks plus a robust power rail. When a two-times wide power rail is assumed to be wide enough to prevent voltage drop on power transmission or electromagnetic coupling issues, this results in a minimum cell height of 6 wiring tracks (6T).

To further scale cell height while maintaining robust power delivery, the semiconductor industry is looking toward buried power rail (BPR). Moving the power rails below the device plane allows the cell height to be reduced to 5 T (i.e. 4 wiring tracks for signaling plus one wiring track to absorb line-end extensions and tip-to-tip spacing in tightly packed cells).

While buried power rail (BPR) plays a vital role in exploiting 3D transistor-on-transistor stacking to open up a new path forward at the end of 2D scaling, a new challenge is presented: how to get power into the BPRs. Connecting a power rail, which now sits below the device plane, with the power-delivery network (PDN), which sits above the device plane, requires a tall power connection. This power connection cannot afford to be too small for risk of creating a current pinch-point or be too large for risk of interfering with dense cell placement.

Realizing the advantages of CFET and BPR as outlined above, and further realizing the need for a robust, low-resistance means of delivering power into the BPR, a unique middle-of-line power-delivery-network approach is provided in the present disclosure.

Aspects of the present disclosure provide a method for fabricating a semiconductor device. For example, the method can include forming a first power rail, forming a first power input structure for coupling with a first terminal of a power source that is external of the semiconductor device to receive electrical power from the power source, forming an active device between the first power rail and the first power input structure, and forming a first middle-of-line rail with a plurality of layers. The first middle-of-line rail can be configured to deliver the electrical power from the first power input structure to the first power rail. The first power rail can provide the electrical power to the active device for operation. Topmost and bottommost ones of the layers of the first middle-of-line rail can be as high as and leveled with top and bottom surfaces of the active device, respectively.

Further, in some embodiments, the method can also include forming a second power rail that is parallel with the first power rail, forming a second power input structure for coupling with a second terminal of the power source to receive the electrical power from the power source, and forming a second middle-of-line rail with a plurality of layers, the second middle-of-line rail being parallel with the first middle-of-line rail, and the first and second middle-of-line rails delivering the electrical power from the first and second input structures to the first and second power rails, the first and second power rails providing the electrical power to the active device for operation. In an embodiment, the first and second middle-of-line rails can be perpendicular to the first and second power rails.

In an embodiment, forming the active device and the first middle-of-line rail can further include forming a cell row of cell circuits that have a same height, the first middle-of-line rail including a section in a power tap cell that is disposed in the cell row, the power tap cell having a same cell height as the cell circuits. For example, the method can further include using at least one of the layers of the first middle-of-line rail to form connections within a cell circuit. As another example, the method can further include forming multiple cell rows of cell circuits with power tap cells disposed in the multiple cell rows, and forming the first middle-of-line rail using respective sections in the power tap cells. In an embodiment, the method can further include forming the power tap cells that are aligned in a column. In another embodiment, each section of the sections in the respective power tap cells can be connected to the first power rail by at least a power via, and is connected to a metal rail by at least a contact.

In an embodiment, the method can further include forming the active device having a second transistor and a first transistor that is disposed above the second transistor in a vertical direction that is parallel to a direction in that the active device is formed between the first power rail and the first power input structure. In another embodiment, the method can further include forming the first middle-of-line rail in a first layer that is used for forming local interconnects in the first transistor, a second layer that is used for forming local interconnects in the second transistor, and a strap layer that merges the first layer and the second layer. For example, the first layer can be the topmost one of the layers, and the second layer can be the bottommost one of the layers.

In an embodiment, the method can further include forming an upper metal layer power delivery network between the first power input structure and the first middle-of-line rail, the upper metal layer power delivery network configured to deliver the electric power from the first power input structure to the first middle-of-line rail. In another embodiment, the method can further include forming first to seventh metal layers stacked over one another sequentially between the first power input structure and the first middle-of-line rail, wherein the upper metal layer power delivery network includes metal wires that are formed in the first to seventh metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
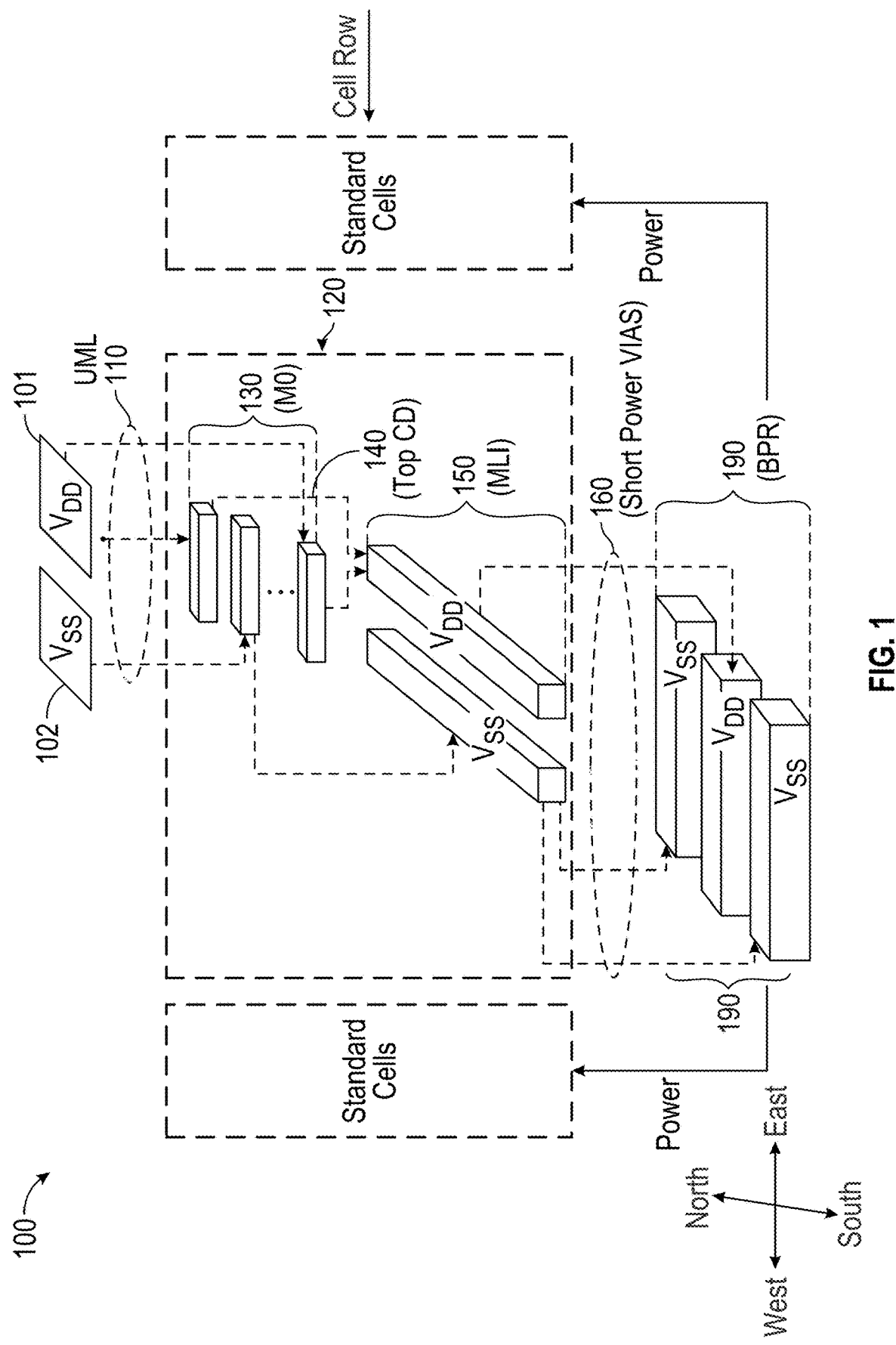
FIG. 1 shows a diagram of a semiconductor device according to some embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide a semiconductor device that uses buried power rails (BPRs) to reduce height of standard cells for circuits, and thus reduce area occupation of standard cells and the circuits. The BPRs form a BPR power delivery network to provide power to circuits, such as logic circuits, analog circuits, memory circuits, and the like in the semiconductor device. The semiconductor device further includes a plurality of power tap cells that are disposed with the standard cells in a plane for active devices.

The power tap cells form a middle-of-line (MOL) power delivery network (PDN) in the semiconductor device. The MOL power delivery network is disposed between the BPR power delivery network and an upper metal layers (UML) power delivery network.

Generally, the semiconductor device includes multiple metal layers, such as eight metal layers that are referred to as M0-M7. In some examples, the metal layer M0 is generally used for connections within a standard cell, and the metal layers M1-M7 are above the metal layer M0 and can be used for connections between different cells. In some embodiments, the MOL power delivery network is implemented using one or more layers of the standard cells, such as local interconnects, M0 and the like for forming the MOL power delivery network. The UML power delivery network is formed by upper metal layers, such as metal layers M1-M7. The MOL power delivery network interconnects the BPR power delivery network and the UML power delivery networks.

The MOL power delivery network assists power injection from the UML power delivery network to the BPR power delivery network. For example, power is distributed from the UML power delivery network to the MOL power delivery network, and from the MOL power delivery network to the BPR power delivery network. According to some aspects of the disclosure, the MOL power delivery network is configured to minimize current crowding and voltage drop due to excessive resistance during power delivery. In an aspect of the disclosure, the MOL power delivery network is configured to maximize the number of redundant connections between the UML power delivery network and BPR power delivery network. In another aspect of the disclosure, the MOL power delivery network form intermediate power delivery rails that are disposed perpendicular to the BPRs.

FIG. 1 shows a diagram illustrating a semiconductor device 100 according to some embodiments of the disclosure. The semiconductor device 100 includes power input structures 101 and 102, an UML power delivery network 110, a MOL power delivery network 120 and a BPR power delivery network 190 coupled together. The MOL power delivery network 120 is formed in the layers that form active devices, such as logic circuits, memory cells, and the like, and is configured to assist power injection from the UML power delivery network 110 to the BPR power delivery network 190. The BPR power delivery network 190 is configured to provide power to the active devices. In some embodiments, the logic circuits are implemented using standard cells, and the MOL power delivery network 120 is formed by a plurality of power tap cells. The power tap cells can be disposed with the standard cells in a layout during circuit and layout design.

It is noted that the semiconductor device 100 can be any suitable device, for example, a semiconductor chip (or die), a semiconductor wafer with multiple semiconductor dies formed on the semiconductor wafer, a stack of semiconductor chips, a semiconductor package that includes one or more semiconductor chips assembled on a package substrate, and the like.

According to some aspects of the disclosure, the semiconductor device 100 includes active devices, such as logic circuits, analog circuits, memory circuits, and the like. The active devices are formed in layers that are suitably deposited and patterned. In some embodiments, the logic circuits are implemented using standard cells, such as inverter cells, NAND cells, NOR cells, and the like from a standard cell library. Each of the standard cells is configured to perform one or more operations. In an example, an inverter cell is configured to perform a logic inversion operation, thus the inverter cell generates an output having an inverted logic value of an input. For example, when the input has a logic value "0" in binary, the output has a logic value "1" in binary; and when the input has a logic value "1" in binary, the output has a logic value "0" in binary. In some examples, among the standard cells, the inverter cell is the smallest logic cell and occupies the smallest area in an example. The power tap cell is configured to have the same size as or smaller size than the inverter cell in some embodiments.

In some examples, the power input structures 101 and 102 are input pads that are configured to receive power from a power source (not shown) that is external of the semiconductor device. For example, the external power source has a $V_{DD}$ terminal and a Vss terminal. $V_{DD}$ is used to represent the high voltage level side of the power source, such as 5V, 3V, 1.5V, and the like, and the Vss is used to represent the low voltage level side of the power source, such as ground in an example. The power input structure 101 is electrically coupled to the $V_{DD}$ terminal of the power source, and the power input structure 102 is electrically coupled to the Vss terminal of the power source. In some examples, the power input structures 101 and 102 are formed of a top metal layer.

The UML power delivery network 110 includes electrical connections in upper metal layers that are coupled to form a power delivery network. For example, when the semiconductor device 100 include metal layers M0 to M7 above the active devices, the UML power delivery network 110 includes some wires that are formed in the metal layers M7 to M1, and includes via connections that connect the wires in the different metal layers.

The buried power rails of the BPR power delivery network 190 are formed under the physical devices (e.g., active devices, transistors) to allow cell footage reduction. For example, generally standard cells in a standard cell library are realized as fixed-height, variable-width cells. The fixed height enables cells to be placed in rows, and eases the process of automated layout design. In some examples, the row direction is an orientation referred to as east-west orientation, and a direction that is perpendicular to the east-west orientation is referred to as north-south orientation. With this naming convention, M0 would typically contain lines running in an east-west orientation while M1 would have lines running in a north-south orientation. Subsequent metal layers would run perpendicular with respect to the preceding metal layers in some examples.

Burying the power rails under the physical devices can allow for the cell height of the standard cell to be defined by the number of routing tracks or signal lines as opposed to a combination of power rails and routing tracks. In some examples, the cell height can be scaled easily down from a 6.0 to 6.5 routing tracks (6.5 T) cell height (assuming either a power rail width equal to either 2 or 3 times that of a routing track line) to a 5.0 routing track cell height through incorporation of this concept, even if the number of actual routing tracks are the same.

In the FIG. 1 example, the buried power rails for $V_{DD}$ and Vss are alternatively disposed in parallel and are extended respectively in the east-west orientation. In some embodiments, shallow-trench isolation (STI) is used to isolate active devices. The buried power rails can be encased either within the STI or within the bulk silicon and STI together, and the buried power rails are buried below a plane of layers that form the active devices. In some embodiments, rail openings can be formed in the STI, and down into the bulk silicon, then the rail openings can be filled with conductive metal materials, such as copper, cobalt, or aluminum, ruthenium, and the like, such as disclosed in Applicant's co-pending application Ser. No. 16/011,377, filed on Jun. 18, 2018, which is incorporated herein by reference in its entirety.

In some embodiments, the rows of standard cells are also in the east-west orientation. The power rails can have a relatively wider width than regular routing tracks, such as about 2 or 3 times of width of the routing tracks. In some examples, adjacent rows of standard cells can be disposed of reverse orientations to share one power rail. For example, standard cells in a first row are in a north-south orientation (e.g., $V_{DD}$ in the north, Vss in the south), and standard cells in a second row are in a south-north orientation (e.g., $V_{DD}$ in the south, Vss in the north). When the first row is north of the second row, a Vss power rail can provide Vss to standard cells in both the first row and the second row.

In the FIG. 1 example, a power tap cell 120 is disposed with standard cells in a cell row. It is noted that, in some examples, multiple power tap cells 120 can be disposed in a cell row.

According to some aspects of the disclosure, the power tap cell 120 is formed in the device plane with active devices, and includes redundant connections to interface the UML power delivery network 110 above the device plane with the BPR power delivery network 190 that sits below the device plane. Further, the power tap cell 120 uses continuously merged local interconnects to help redistribute the current load while highly redundant connections reduce the overall resistance.

Specifically, the power tap cell 120 includes rails 150 that are formed by merged local interconnects, and the rails 150 are referred to as merged local interconnect (MLI) rails 150. In an example, the MLI rails 150 are formed of a top local interconnect (LI), a bottom LI, and a strap layer that straps the top LI with the bottom LI to continuously merge the top LI with the bottom LI.

The MLI rails 150 are connected with the buried power rails using short power via structures 160. In the FIG. 1 example, when the buried power rails 190 are in the east-west orientation, the MLI rails 150 are in the north-south orientation.

Further, the power tap cell 120 includes rails 130 that are formed in the metal layer M0, and rails 130 are referred to as M0 rails 130. The M0 rails 130 are in the east-west orientation. The M0 rails 130 are connected with, for example wires in the metal layer M1 using vias that are referred to as V0, and are connected with the MLI rails 150 using top contact to diffusion (CD) structures 140.

According to some aspects of the disclosure, the components used in the power tap cell 120 are similar to some components that are used to implement the standard cells, thus the power tap cell 120 can be fabricated using the same manufacturing process that fabricates active devices. In an embodiment that uses CFET approach, a logic standard cell has an N-type device (e.g., N-type metal-oxide-semiconductor transistor or NMOS transistor) and a P-type device (P-type metal-oxide-semiconductor transistor or PMOS transistor), and the N-type device is disposed on-top of the P-type device while sharing a common gate. In some examples, MLI rails 150 are formed in a similar manner as the drain connections of an inverter cell. For the inverter cell, the drains of the N-type device and the P-type device are connected. In an example, the drain connections of the inverter cell includes a top LI to the drain of the N-type device, a bottom LI to the drain of the P-type device, and a strap connection of the top LI and the bottom LI. Similarly, each of the MLI rails 150 is formed of the top LI, the bottom LI and the strap connection that merges the top LI and the bottom LI.

It is noted that, in some embodiments, additional mask(s) and processes can be used to form the strap connection of the top LI and the bottom LI, and thus to form the MIL rails 150.

The top LI, bottom LI and the strap connection of the MIL rails 150 can be respectively formed of any suitable conductive materials or a combination of conductive materials, such as copper, cobalt, or aluminum, ruthenium, titanium, doped polysilicon, and the like.

It is noted that, standard cells may use some other components. For example, a standard cell also includes tall power via structures, and bottom CD structures. In some examples of CFET, power is provided from the BPR 190 to the active devices using power via structures. In an example, the N-type device is disposed above the P-type device in a vertical direction that is perpendicular to a main surface of the substrate, the buried power rails (e.g., Vss) are connected to the N-type devices using high power via structures and the buried power rails (e.g., $V_{DD}$) are connected to the P-type using short power via structures. In some examples of CFET, the metal layer M0 is connected to the active devices using contact to diffusion (CD) structures. In an example, the metal layer M0 can be connected to the N-type devices using top CD structures, and can be connected to the P-type devices using bottom CD structures. Generally, the tall power via structures have higher resistances than the short power via structures and the bottom CD structures have higher resistances than the top CD structures. Using the short power via structures and the top CD structures in MOL power delivery network 120 can reduce voltage drop on the power delivery.

Figure 2:
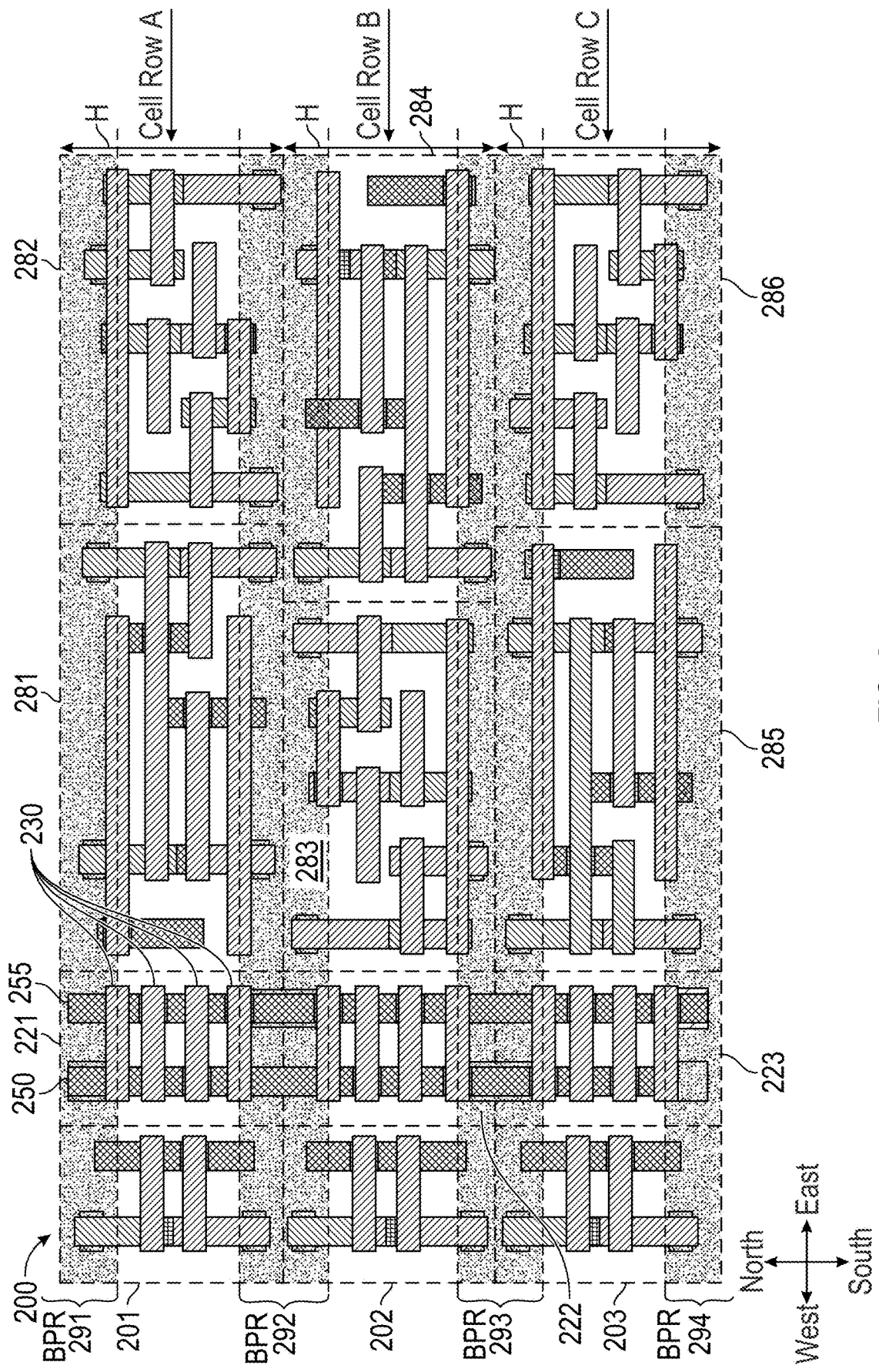
FIG. 2 shows a top view of a semiconductor device according to some embodiments of the disclosure.

FIG. 2 shows a top view of a semiconductor device 200 according to some embodiments of the disclosure. The semiconductor device 200 is formed of patterns in various layers. It is noted that some layers, such as polysilicon layer, and the like, are omitted in FIG. 2 for ease and clarity.

In the FIG. 2 example, the semiconductor device 200 includes three cell rows that are referred to as cell row A, cell row B and cell row C. The cell rows are in the east-west orientation, and have the same height H. Each cell row includes multiple cells, such as logic standard cells, power tap cells and the like. For example, cell row A includes an inverter cell 201, a power tap cell 221, and other logic cells 281 and 282; cell row B includes an inverter cell 202, a power tap cell 222 and other logic cells 283 and 284; and cell row C includes an inverter cell 203, a power tap cell 223, and other logic cells 285 and 286. The power tap cells 221-223 occupy about the same footprint as the inverter cells.

In the FIG. 2 example, the power tap cells 221-223 are aligned in the north-south orientation and each of power tap cells 221-223 includes sections of middle-of-line rails, and the sections are connected into the rails. For example, the two MLI rails 250 and 255 are formed by connecting sections in each of the power tap cells 221-223. Further, the cells in the cell rows are suitably orientated, the cell row A and cell row B share a BPR 292 (e.g., for Vss), and the cell row B and cell row C share a BPR 293 (e.g., for $V_{DD}$). It is noted that the cell row A may share a BPR 291 (e.g., for $V_{DD}$) with a neighboring row (not shown) in the north direction, and the cell row C may share a BPR 294 (e.g., for VSS) with a neighboring row (not shown) in the south direction.

In the FIG. 2 example, the height of the standard cells can support four M0 rails. In the power tap cells 221-223, the M0 rails 230 can form multiple redundant connections respectively with the two MLI rails 250 and 255 and respectively couple the two MLI rails 250 and 255 to UML power delivery network (not shown in FIG. 2). The details of the semiconductor device 200 will be described with reference to FIGS. 3-5.

Figure 3:
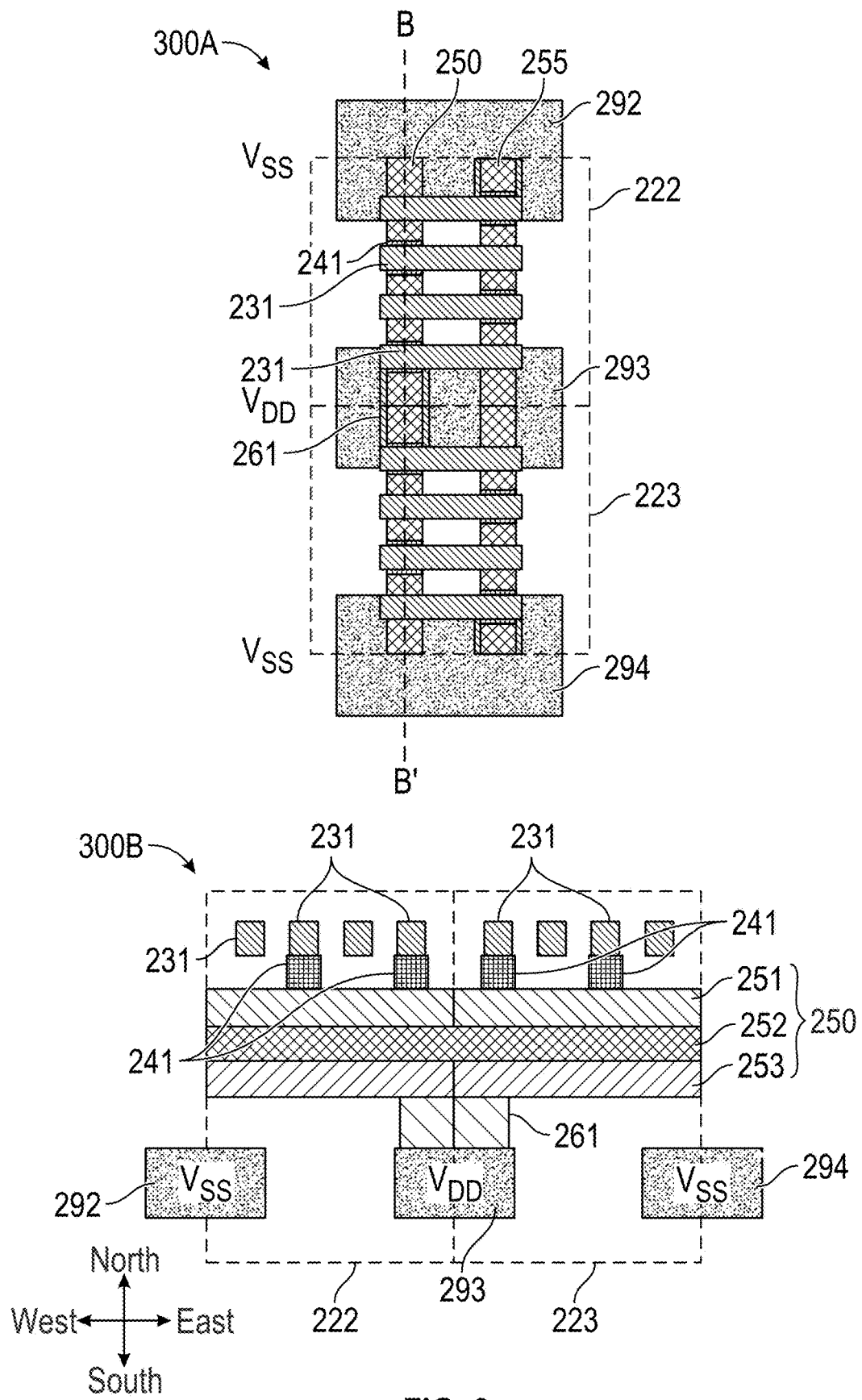
FIG. 3 shows a top view and a cross-sectional view of power tap cells, according to some embodiments of the disclosure.

FIG. 3 shows a top view 300A and a cross-sectional view 300B of the power tap cell 222 and the power tap cell 223, according to some embodiments of the disclosure. The cross-sectional view 300B is taken along a line B-B' in the top view 300A.

In the FIG. 3 example, the BPRs 292-294 are disposed to extend in the east-west orientation, and the MLI rails 250 and 255 are disposed in the north-south orientation that is perpendicular to the BPRs 292-294.

The MLI rail 250 is formed by a top LI structure 251, a strap structure 252 and a bottom LI structure 253. The MLI rail 250 is connected to the BPRs 293 by a short via structure 261. The MIL rail 250 is connected to the M0 rails 231 for the $V_{DD}$ by top CD structures 241.

In the FIG. 3 example, each power tap cell includes connections from M0 rails to a BPR for $V_{DD}$. When the power tap cells that are disposed in the cell rows are connected in a manner as shown in FIG. 2, the power tap cells can redistribute the current load across the BPRs, and redundant connections can reduce the overall resistance.

Figure 4:
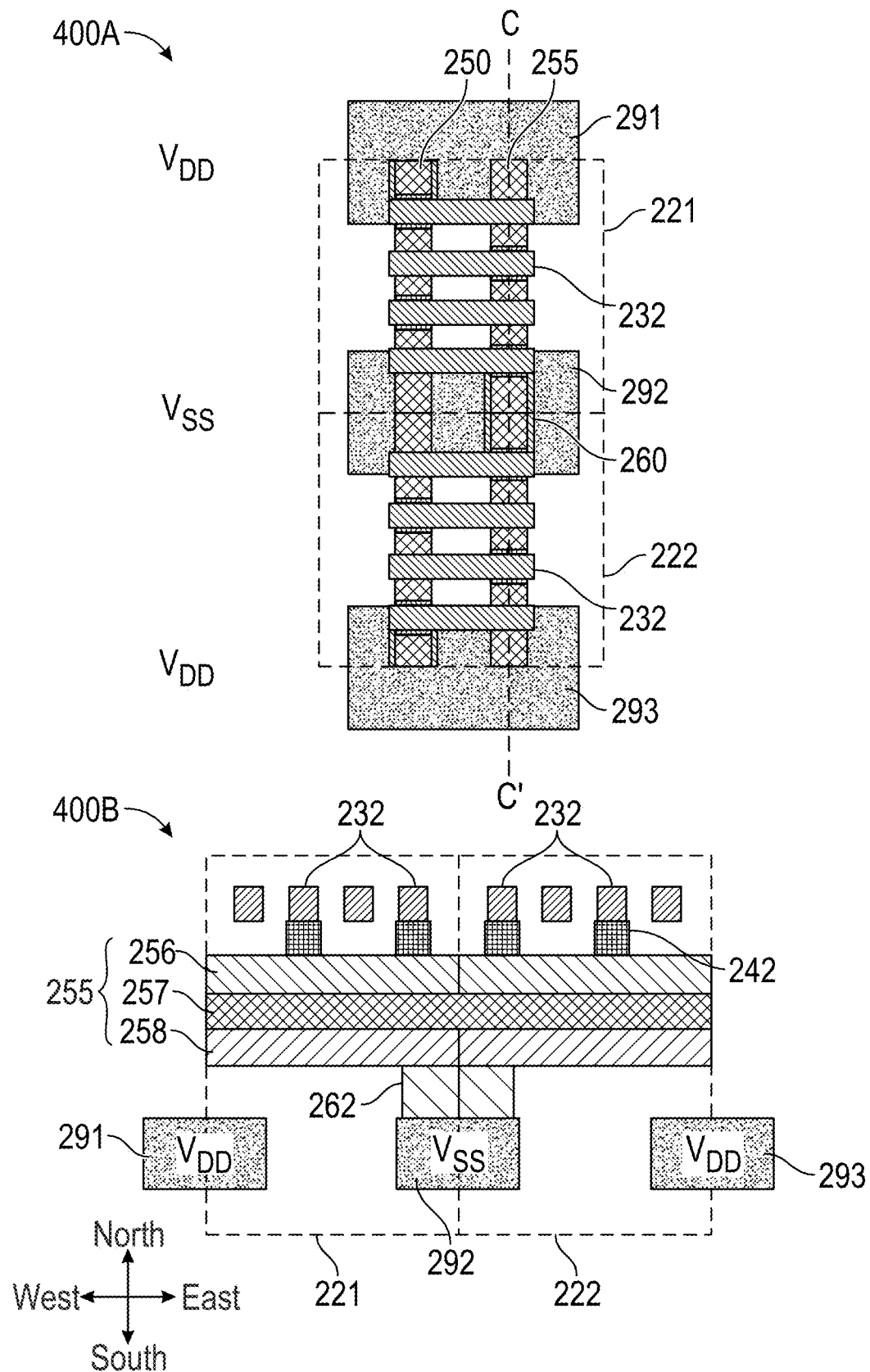
FIG. 4 shows a top view and a cross-sectional view of power tap cells, according to some embodiments of the disclosure.

FIG. 4 shows a top view 400A and a cross-sectional view 400B of the power tap cell 221 and the power tap cell 222, according to some embodiments of the disclosure. The cross-sectional view 400B is taken along a line C-C' in the top view 400A.

In the FIG. 4 example, the BPRs 291-293 are disposed to extend in the east-west orientation, and the MLI rails 250 and 255 are disposed in the north-south orientation that is perpendicular to the BPRs 291-293.

The MLI rail 255 is formed by a top LI structure 256, a strap structure 257 and a bottom LI structure 258. The MLI rail 255 is connected to the BPR 292 by a short via structure 262. The MIL rail 255 is connected to the M0 rails 232 for the Vss by top CD structures 242.

In the FIG. 4 example, each power tap cell includes connections from M0 rails to a BPR for VSS. When the power tap cells that are disposed in the cell rows are connected as shown in FIG. 2, the power tap cells can redistribute the current load across the BPRs, and redundant connections can reduce the overall resistance.

Figure 5:
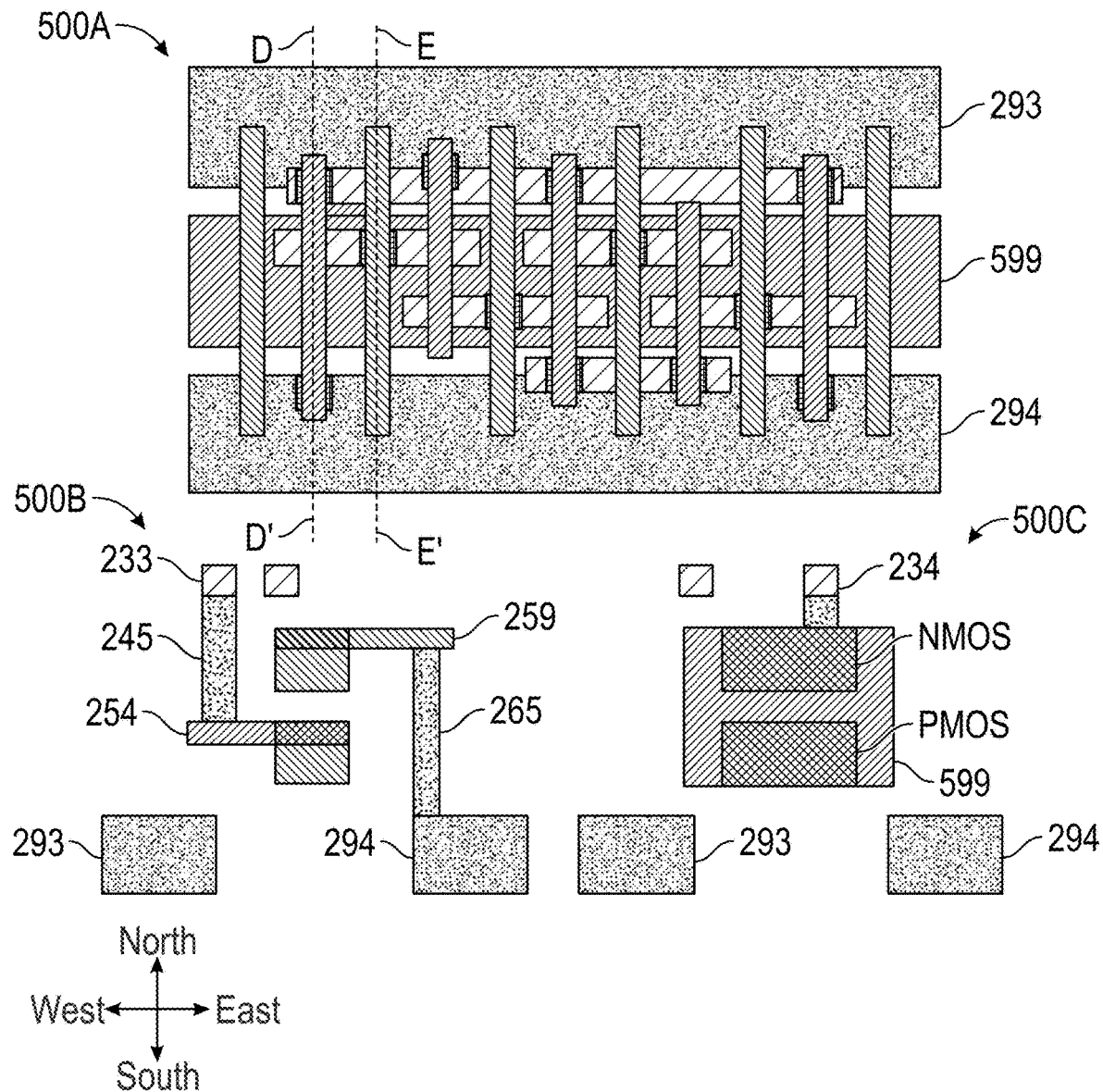
FIG. 5 shows a top view and a cross-sectional view of a logic cell, according to some embodiments of the disclosure.

FIG. 5 shows a top view 500A and two cross-sectional views 500B and 500C of the logic cell 286 according to some embodiments of the disclosure. The cross-sectional view 500B is taken along a line D-D' in a source/drain area of a CFET and the cross-sectional view 500C is taken along a line E-E' in a gate area of the CFET.

In the FIG. 5 example, an N-type device is formed above a P-type device in an active structure 599. The source of the N-type device is connected to the BPR 294 for VSS by a top LI structure 259 and a tall power via 265, and the drain of the P-type device is connected to a M0 rail 233 by a bottom LI structure 254 and a bottom CD 245.

Figure 6:
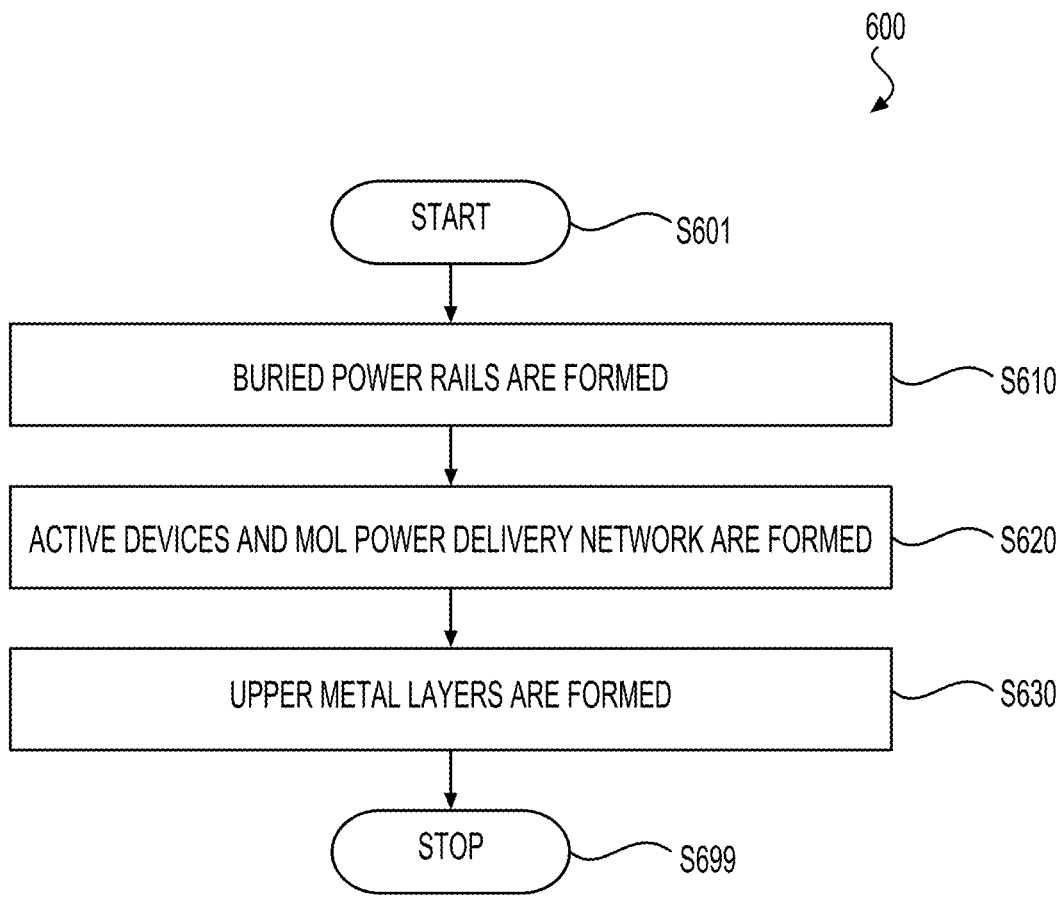
FIG. 6 shows a flow chart outlining a process example according to some embodiments of the disclosure.

FIG. 6 shows a flow chart outlining a process example for fabricating a semiconductor device, such as the semiconductor device 100, the semiconductor device 200 and the like. The process starts at 5601 and proceeds to 5610.

At 5610, buried power rails are formed in rail openings within isolation trench on a substrate. The buried power rails form a BPR power delivery network in an example.

At 5620, active devices and MOL power delivery network are formed. In some examples, the MOL power delivery network includes MIL rails and M0 rails. In an example, a MIL rail includes a top LI structure, a bottom LI structure and a strap structure that merges the top LI structure and the bottom LI structure. The MIL rails are connected with the BPRs by short power vias, and the MIL rails and the M0 rails are connected by top CD structures.

At 5630, upper metal layers are formed, via structures that connect wires in different metal layers are also formed. An UML power delivery network is formed in the upper metal layers. In an example, power input pads are formed in the top metal layer. Then, the process proceeds to 5699 and terminates.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating a semiconductor device, comprising:
    forming a first power rail;
    forming a first power input structure for coupling with a first terminal of a power source that is external of the semiconductor device to receive electrical power from the power source;
    forming an active device between the first power rail and the first power input structure; and
    forming a first middle-of-line rail with a plurality of layers, the first middle-of-line rail being configured to deliver the electrical power from the first power input structure to the first power rail, the first power rail providing the electrical power to the active device for operation, topmost and bottommost ones of the layers of the first middle-of-line rail being as high as and leveled with top and bottom surfaces of the active device, respectively.

2. The method of claim 1, further comprising:
    forming a second power rail that is parallel with the first power rail;
    forming a second power input structure for coupling with a second terminal of the power source to receive the electrical power from the power source; and
    forming a second middle-of-line rail with a plurality of layers, the second middle-of-line rail being parallel with the first middle-of-line rail, and the first and second middle-of-line rails delivering the electrical power from the first and second input structures to the first and second power rails, the first and second power rails providing the electrical power to the active device for operation.

3. The method of claim 2, wherein:
    the first and second middle-of-line rails are perpendicular to the first and second power rails.

4. The method of claim 1, wherein forming, the active device and the first middle-of-line rail further comprises:
    forming a cell row of cell circuits that have a same height, the first middle-of-line rail including a section in a power tap cell that is disposed in the cell row, the power tap cell having a same cell height as the cell circuits.

5. The method of claim 4, further comprising:
    using at least one of the layers of the first middle-of-line rail to form connections within a cell circuit.

6. The method of claim 4, further comprising:
    forming multiple cell rows of cell circuits with power tap cells disposed in the multiple cell rows; and
    forming the first middle-of-line rail using respective sections in the power tap cells.

7. The method of claim 6, further comprising:
    forming the power tap cells that are aligned in a column.

8. The method of claim 6, wherein each section of the sections in the respective power tap cells is connected to the first power rail by at least a power via, and is connected to a metal rail by at least a contact.

9. The method of claim 1, further comprising:
    forming the active device having a second transistor and a first transistor that is disposed above the second transistor in a vertical direction that is parallel to a direction in that the active device is formed between the first power rail and the first power input structure.

10. The method of claim 9, further comprising:
    forming the first middle-of-line rail in a first layer that is used for forming local interconnects in the first transistor, a second layer that is used for forming local interconnects in the second transistor, and a strap layer that merges the first layer and the second layer.

11. The method of claim 10, wherein the first layer is the topmost one of the layers, and the second layer is the bottommost one of the layers.

12. The method of claim 1, further comprising:
    forming an upper metal layer power delivery network between the first power input structure and the first middle-of-line rail, the upper metal layer power delivery network configured to deliver the electric power from the first power input structure to the first middle-of-line rail.

13. The method of claim 12, further comprising:

forming first to seventh metal layers stacked over one another sequentially between the first power input structure and the first middle-of-line rail, wherein the upper metal layer power delivery network includes metal wires that are formed in the first to seventh metal layers.

* * * * *